(12) United States Patent
Chow

(10) Patent No.: US 7,501,898 B2
(45) Date of Patent: Mar. 10, 2009

(54) METHOD AND APPARATUS FOR GENERATING AN OPTIMIZED REFERENCE CURRENT THRESHOLD

(75) Inventor: Fun Kok Chow, Singapore (SG)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 663 days.

(21) Appl. No.: 11/271,074

(22) Filed: Nov. 10, 2005

(65) Prior Publication Data
US 2007/0115068 A1    May 24, 2007

(51) Int. Cl.
*H03F 3/08* (2006.01)
*H03K 19/0175* (2006.01)

(52) U.S. Cl. ............... 330/308; 250/214 A; 326/82

(58) Field of Classification Search ........... 330/308; 250/214 A, 551, 205
See application file for complete search history.

(56) References Cited

U.S. PATENT DOCUMENTS

| | | | |
|---|---|---|---|
| 6,784,750 B2 * | 8/2004 | Chiou et al. | 330/308 |
| 6,803,825 B2 * | 10/2004 | Chiou et al. | 330/308 |
| 2004/0196105 A1 * | 10/2004 | Filip | 330/308 |
| 2006/0197452 A1 * | 9/2006 | Zhang | 315/32 |
| 2008/0061217 A1 * | 3/2008 | Burkatovsky | 250/214 A |

* cited by examiner

*Primary Examiner*—Rexford Barnie
*Assistant Examiner*—Dylan White

(57) ABSTRACT

In one embodiment, apparatus is provided with current optimization logic, a programmable current source for generating a reference current threshold, and current programming logic. In response to a plurality of input pulses received by a first TIA, the current optimization logic produces a series of digitized current values in response to i) a signal correlated to an output of the first TIA, to ii) a reference signal to which the output of the first TIA is compared. The current programming logic i) programs the programmable current source using ones of the series of digitized current values, until a predetermined condition is met, and then ii) locks the programmable current source to a most recent one of the digitized current values. In response to the reference current threshold, a second TIA produces the reference signal.

18 Claims, 3 Drawing Sheets

METHOD AND APPARATUS FOR GENERATING AN OPTIMIZED REFERENCE CURRENT THRESHOLD

BACKGROUND

The performance of an opto-coupler is highly dependent on process and assembly variations. One aspect of an opto-coupler that can be affected by process and assembly variations is its reference current threshold.

Sometimes, manufacturers attempt to control an opto-coupler's reference current threshold by carefully controlling the opto-coupler's process and assembly attributes (e.g., by ensuring that process and assembly parameters remain within specification).

Alternately, or additionally, an opto-coupler's reference current threshold may be trimmed at the wafer sort level. However, trimming at the wafer sort level does not account for process and assembly steps that occur subsequent to the wafer sort level (e.g., process and assembly steps at the packaging level). As a result, trimming at the wafer sort level can be of limited use.

SUMMARY OF THE INVENTION

In one embodiment, apparatus comprises current optimization logic, a programmable current source for generating a reference current threshold, and current programming logic. In response to a plurality of input pulses received by a first transimpedance amplifier (TIA), the current optimization logic produces a series of digitized current values in response to comparisons of i) a signal correlated to an output of the first TIA, to ii) a reference signal to which the output of the first TIA is compared. The current programming logic is provided to i) program the programmable current source using ones of the series of digitized current values, until a predetermined condition is met, and then ii) lock the programmable current source to a most recent one of the digitized current values. In response to the reference current threshold generated by the programmable current source, a second TIA produces the reference signal.

In another embodiment, a method for optimizing a reference current threshold of a post assembled opto-coupler comprises, in response to a plurality of input pulses received by a TIA of the opto-coupler, producing a series of digitized current values in response to comparisons of i) a signal correlated to an output of the TIA, to ii) a reference signal to which the output of the TIA is compared. Until a predetermined condition is met, a programmable current source is programmed using ones of the series of digitized current values, the programmable current source generating the reference current threshold. After the predetermined condition is met, the programmable current source is locked to a most recent one of the digitized current values. The reference signal is produced in response to the reference current threshold generated by the programmable current source.

Other embodiments are also disclosed.

BRIEF DESCRIPTION OF THE DRAWINGS

Illustrative embodiments of the invention are illustrated in the drawings in which.

DETAILED DESCRIPTION

Figure 1:
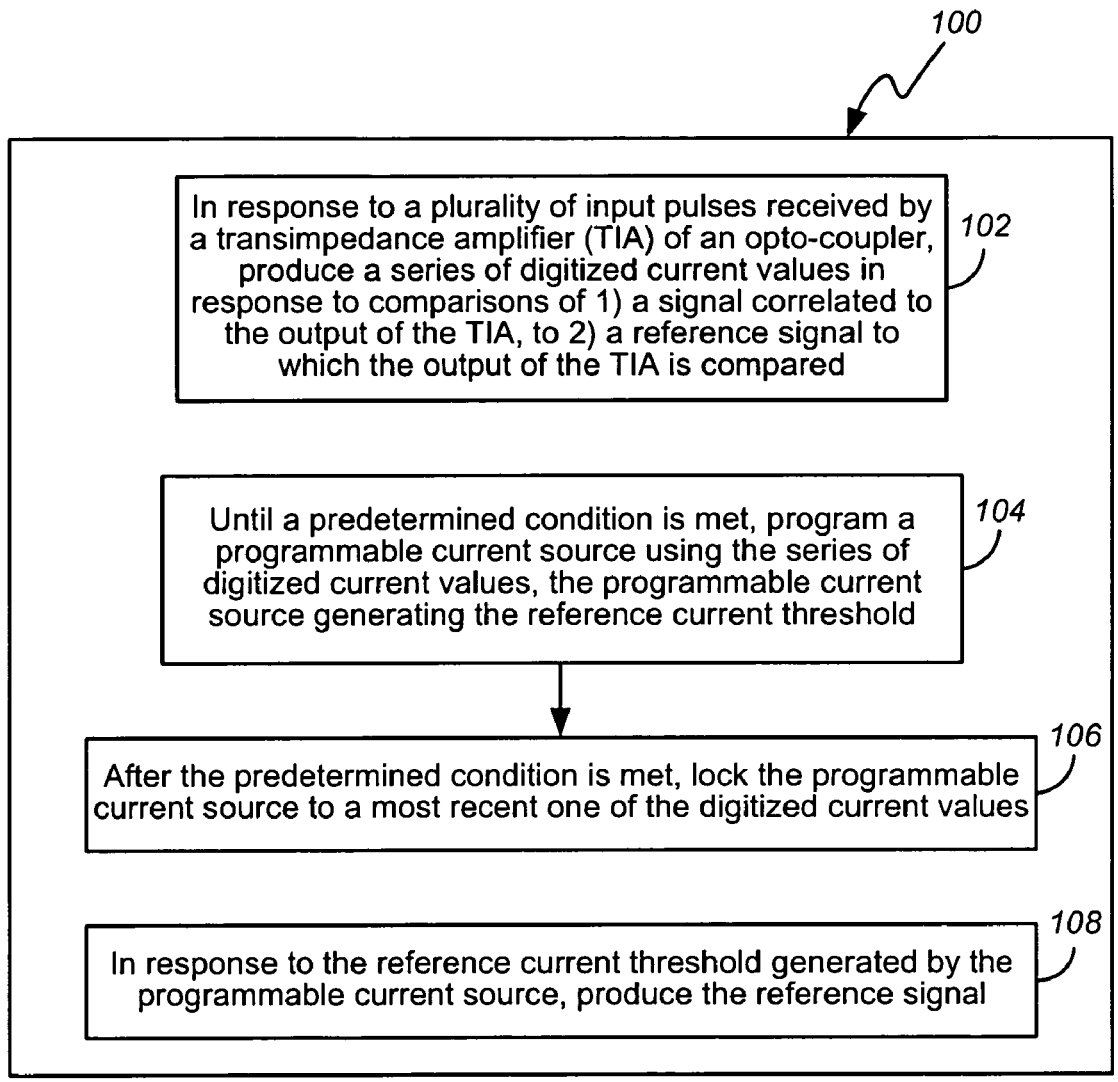
FIG. 1 illustrates an exemplary method for optimizing an opto-coupler's reference current threshold.

Given the limitations of existing methods for optimizing an opto-coupler's reference current threshold, FIG. 1 illustrates a new method 100 for optimizing an opto-coupler's reference current threshold. The method 100 is advantageous, in one respect, in that it enables optimization of an opto-coupler's reference current threshold in the context of all of the opto-coupler's process and assembly variations. That is, the method 100 can be applied to a post-assembled opto-coupler.

The method 100 commences with the step 102 of, in response to a plurality of input pulses received by a transimpedance amplifier (TIA) of an opto-coupler, producing 102 a series of digitized current values in response to comparisons of 1) a signal correlated to the output of the TIA, to 2) a reference signal to which the output of the TIA is compared. Until a predetermined condition is met, a programmable current source is programmed 104 using ones of the series of digitized current values. However, after the predetermined condition is met, the programmable current source is locked 106 to a most recent one of the digitized current values.

When programmed, the programmable current source generates a reference current threshold. The reference signal to which the output of the TIA is compared is produced 108 in response to this reference current threshold.

Figure 2:
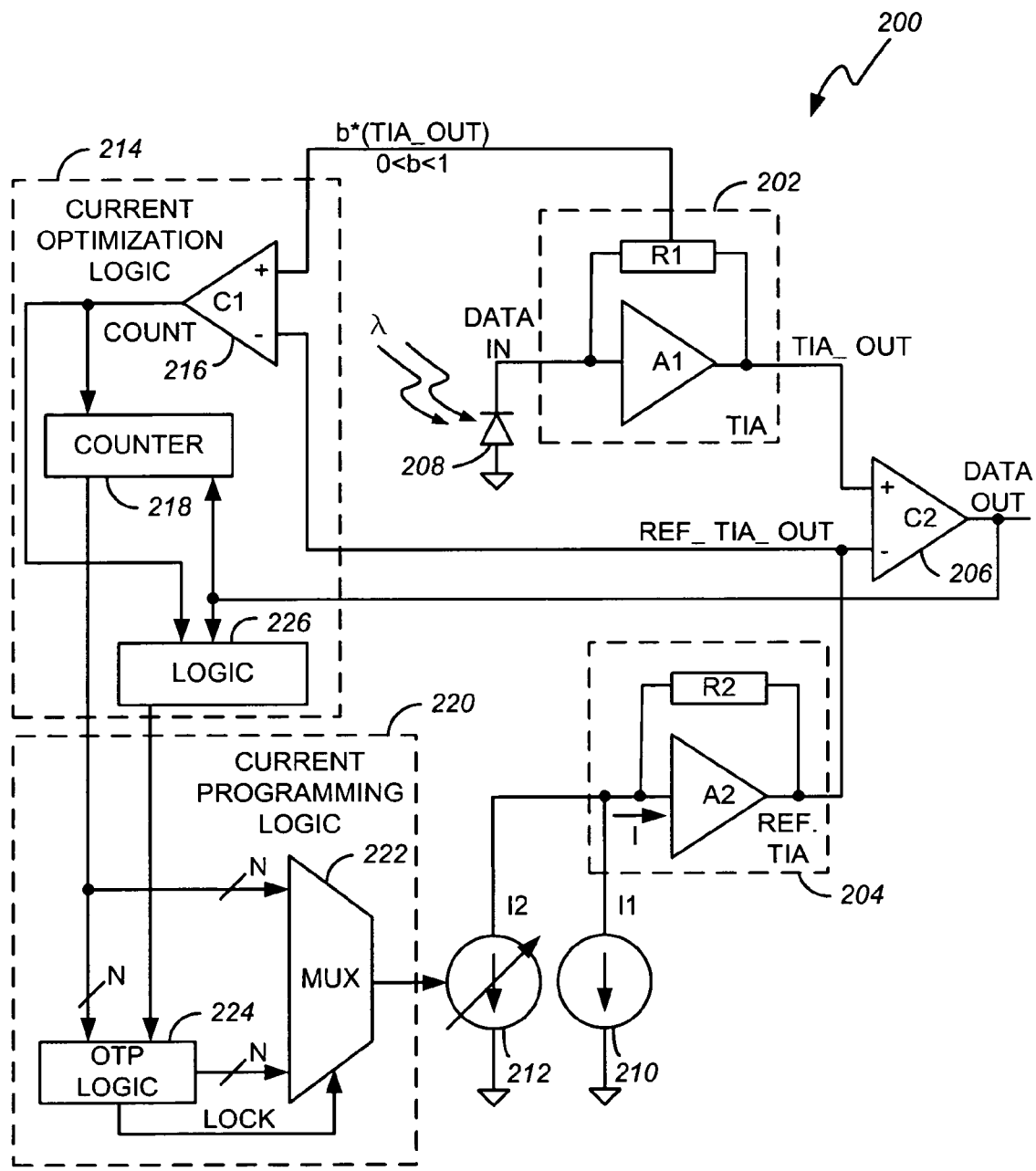
FIG. 2 illustrates an exemplary embodiment of opto-coupler circuitry in which the FIG. 1 method may be implemented.

In one embodiment, the method 100 may be implemented using the circuitry 200 shown in FIG. 2. By way of example, the circuitry 200 comprises first and second TIAs 202, 204, the outputs of which (TIA_OUT and REF_TIA_OUT) are coupled a comparator 206. The output of the second TIA 204 (REF_TIA_OUT) serves as a reference signal to which the output of the first TIA 202 (TIA_OUT) is compared during normal operation of the circuitry 200.

The input of the first TIA 202 is coupled to a photosensor 208, such as a photodiode. The input of the second TIA 204 is coupled to receive a reference current (I). As shown, the reference current (I) may be formed from a combination of first and second reference current thresholds (I1, I2), the first of which (I1) may be produced by a static "base" current source 210, and the second of which (I2) may be produced by a programmable current source 212. Preferably, the first and second TIAs 202, 204 have the same construction.

A signal correlated to the output of the first TIA 202 (TIA_OUT), as well as the reference signal (REF_TIA_OUT), are received by current optimization logic 214. In one embodiment, the signal correlated to the output of the first TIA 202 is a signal derived from a tap of a feedback resistor (R1) of the first TIA 202 (i.e., b*(TIA_OUT); 0<b<1). The constant "b" is selected such that b*(TIA_OUT) is equal to the desired value of REF_TIA_OUT.

In response to the inputs b*(TIA_OUT) and REF_TIA_OUT, and in response to a plurality of input pulses received by the first TIA 202, the current optimization logic 214 outputs a series of digitized current values. By way of example, and in one embodiment, the current optimization logic 214 comprises a comparator 216 that receives and compares the signals b*(TIA_OUT) and REF_TIA_OUT. The output (COUNT) of the comparator 216 is then provided to a counter 218. If the reference signal (REF_TIA_OUT) is less than the signal b*(TIA_OUT), the COUNT signal is asserted. In response to a pulse of the comparator 206 while the COUNT signal is asserted, the value of the counter 218 is incremented.

Although the current optimization logic 214 is shown to compare the signals b*(TIA_OUT) and REF_TIA_OUT, the current optimization logic 214 could alternately compare the signal REF_TIA_OUT to the primary (or normal) output of the first TIA 202. In this case, prior to making a signal comparison, the current optimization logic 214 could calculate a fraction of the signal TIA_OUT, or could calculate a multiple of the signal REF_TIA_OUT.

Values of the counter 218 are output to current programming logic 220 as a series of N-bit digitized current values. Until a predetermined condition is met, the current programming logic 220 programs the programmable current source 212 using ones of the series of digitized current values. As shown, this may be accomplished by providing the series of digitized current values to one input of a multiplexer 222, and then passing the values to the programmable current source 212 via the multiplexer 222.

The values of the counter 218 may also be provided to one-time programmable (OTP) logic 224. Until the predetermined condition is met, the values are not written to the OTP logic 224, and the OTP logic 224 configures the multiplexer 222 to output the series of digitized current values received from the counter 216. However, upon meeting the predetermined condition, the most recent value of the counter 218 is stored (e.g., latched) by the OTP logic 224, and a lock bit of the OTP logic 224 is set. In response to setting the lock bit, the OTP logic 224 asserts the LOCK signal, which causes the multiplexer 222 to output the N-bit count stored by the OTP logic 224. In this manner, the state of the programmable current source 212 may be locked (or fixed).

In one embodiment, the predetermined condition on which the OTP logic 224 is activated is the fall or de-assertion of DATA_OUT (the output of the comparator 206) faster than the fall or de-assertion of COUNT (the output of the comparator 216). The comparative timings of these signals may be assessed by the logic 226.

In another embodiment, the predetermined condition on which the OTP logic 224 is activated is the production of a reference signal (REF_TIA_OUT) that exceeds the signal b*(TIA_OUT). In yet another embodiment, the predetermined condition on which the OTP logic 224 is activated is a predetermined count, such as a count of pulses of DATA_OUT. In this last case, the logic 226 might comprise a second counter (i.e., one that is incremented in response to pulses of DATA_OUT). Typically, it will be necessary to keep a count of pulses of DATA_OUT in any case, so that the programmable current source 212 may be locked to a "best current achievable" in cases where the reference signal (REF_TIA_OUT) cannot be raised to b*(TIA_OUT). Preferably, however, the ranges of the counter 218 and the programmable current source 212 are chosen such that the reference signal (REF_TIA_OUT) will always be able to be raised to b*(TIA_OUT).

Figure 3:
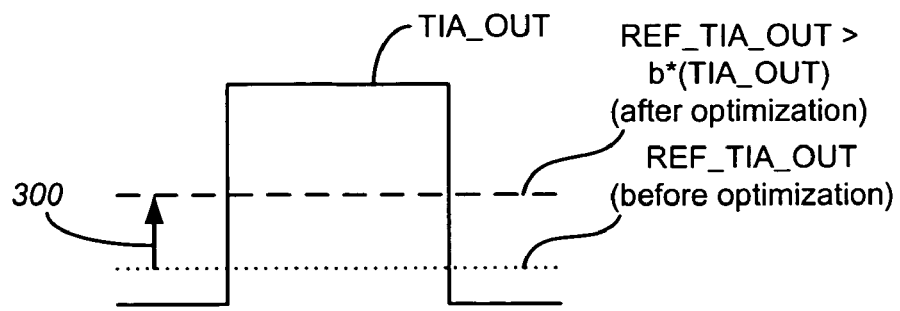
FIG. 3 illustrates optimization of a reference signal (REF_TIA_OUT) to which the output (TIA_OUT) of the FIG. 2 opto-coupler is compared (both before and after optimization of the opto-coupler's reference current threshold)
Figure 4:
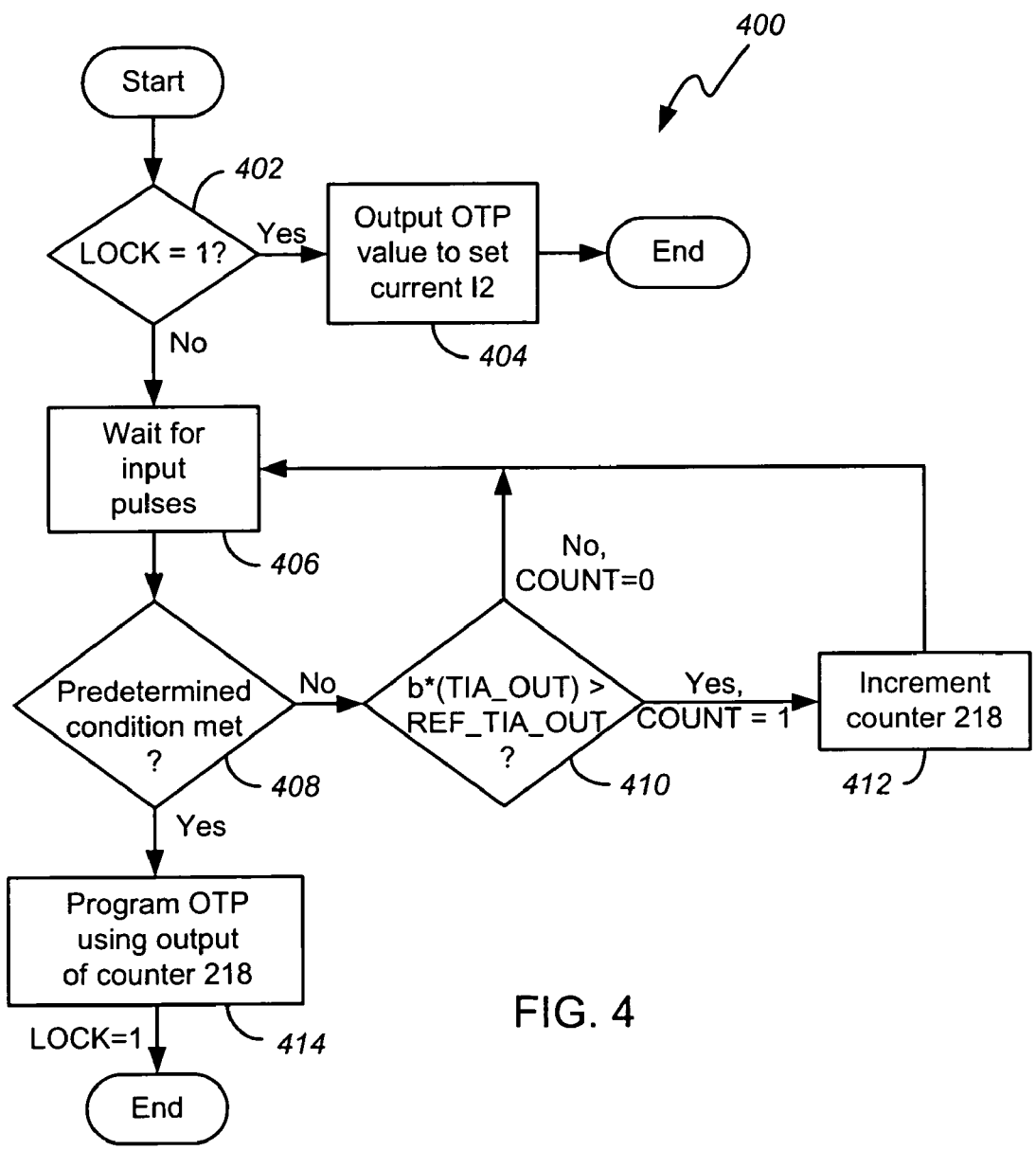
FIG. 4 illustrates an exemplary operation of the current optimization and current programming logic of the FIG. 2 opto-coupler.

FIGS. 3 & 4 illustrate an exemplary operation of the current optimization and current programming logic 214, 220 of the circuitry 200 (FIG. 2). In accord with the flow diagram 400 shown in FIG. 4, and upon powering the circuitry 200, the value of the lock bit stored by the OTP logic 224 is checked 402. If the lock bit is set (i.e., LOCK=1), the N-bit value stored by the OTP logic 224 is output 404, and the value of current 12 is programmed in response thereto. However, if the lock bit is not set (i.e., LOCK=0), the first TIA 202 waits 406 for input pulses.

Upon receiving input pulses, and if the lock bit of the OTP logic 224 is not set, it is determined 408 whether a predetermined condition has been met (e.g., via logic 226). If the condition has not been met, the circuitry 200, via comparator 216, determines 410 whether b*(TIA_OUT) is greater than REF_TIA_OUT. If b*(TIA_OUT) is greater, the output of the comparator 216 is asserted (COUNT=1), and the value of the counter 218 is incremented 412. This, in turn, increases the value of the programmable reference current threshold, and increases the value of the reference signal (REF_TIA_OUT).

As shown in FIG. 3, the circuitry 200 is configured during manufacture so that the value of the reference signal (REF_TIA_OUT) will in all cases be below the value of b*(TIA_OUT). The initial value of the reference signal may be set by means of the "base" current source 210, and may be set so that the value of the reference signal (REF_TIA_OUT) will be below the value of b*(TIA_OUT), regardless of any process and assembly variations that the circuitry 200 might experience.

As the value of the counter 218 is incremented, the value of the reference signal (REF_TIA_OUT) is increased toward the value of b*(TIA_OUT), as indicated by arrow 300 in FIG. 3. When the value of REF_TIA_OUT just exceeds b*(TIA_OUT), the output of the comparator 216 is de-asserted (COUNT=0), and the value of the counter 218 is no longer incremented 412. Then, upon satisfying the predetermined condition 408, the OTP logic 224 is programmed 414 using the most recent value of the counter 218, and the lock bit of the OTP logic 224 is set (i.e., LOCK=1). As previously discussed, the predetermined condition on which the OTP logic 224 is programmed 414 may be, for example, the value of REF_TIA_OUT exceeding b*(TIA_OUT), or a count of a predetermined number of pulses of the output of the first TIA 202 (e.g., $2^N-1$ pulses, which gives the N-bit counter 218 a chance to saturate).

Preferably, the current optimization logic 214, the programmable current source 212, and the current programming logic 220 are all formed on a common semiconductor substrate, along with other elements of the opto-coupler circuitry 200.

In some cases, the opto-coupler circuitry 200 may be initially activated in a controlled environment; and a series of controlled light pulses (I) may be provided to the photosensor 208. In other cases, the opto-coupler circuitry 200 may be initially activated in the field. In either case, the circuitry 212, 214 and 220 can provide an optimized reference current threshold, without the need for external I/O.

By optimizing an opto-coupler's reference current threshold using the method 100 or circuitry 200, pulse width distortion of the opto-coupler's output (i.e., DATA OUT) may be minimized.

What is claimed is:

1. Apparatus, comprising:
   current optimization logic to, in response to a plurality of input pulses received by a first transimpedance amplifier (TIA), produce a series of digitized current values in response to comparisons of i) a signal correlated to an output of the first TIA, to ii) a reference signal to which the output of the first TIA is compared;
   a programmable current source for generating a reference current threshold;
   current programming logic to i) program the programmable current source using ones of the series of digitized current values, until a predetermined condition is met, and then ii) lock the programmable current source to a most recent one of the digitized current values; and a second TIA to, in response to the reference current threshold generated by the programmable current source, produce the reference signal.

2. The apparatus of claim 1, wherein the first TIA comprises a feedback resistor; and wherein the signal correlated to the output of the first TIA is a signal derived from a tap of the feedback resistor.

3. The apparatus of claim 1, wherein the signal correlated to the output of the first TIA is a primary output of the first TIA.

4. The apparatus of claim 1, wherein the current optimization logic comprises:

a first comparator to, in response to the plurality of input pulses, compare i) the signal correlated to the output of the first TIA, to ii) the reference signal; and a first counter that is incremented in response to pulses of the output of the first TIA, wherein values of the first counter provide the series of digitized current values.

5. The apparatus of claim 4, further comprising a second counter that is incremented in response to pulses of the output of the first TIA; wherein said predetermined condition is a predetermined count of the second counter.

6. The apparatus of claim 4, further comprising a second comparator receiving i) the output of the first TIA, and ii) the reference signal.

7. The apparatus of claim 6, further comprising logic to generate said predetermined condition when an output of the second comparator is de-asserted faster than the output of the first comparator.

8. The apparatus of claim 4, wherein the current programming logic further comprises one-time programmable logic to store the digitized current value to which the programmable current source is locked.

9. The apparatus of claim 1, wherein the current optimization logic comprises a counter, and wherein the predetermined condition is a predetermined count of the counter.

10. The apparatus of claim 9, wherein the counter is incremented in response to pulses of the output of the first TIA.

11. The apparatus of claim 1, wherein the current programming logic further comprises one-time programmable logic to store the digitized current value to which the programmable current source is locked.

12. The apparatus of claim 1, further comprising a common semiconductor substrate on which the current optimization logic, the programmable current source and the current programming logic are formed.

13. The apparatus of claim 1, further comprising a photosensor, coupled to an input of the first TIA.

14. A method for optimizing a reference current threshold of an opto-coupler, comprising:

in response to a plurality of input pulses received by a transimpedance amplifier (TIA) of the opto-coupler, producing a series of digitized current values in response to comparisons of i) a signal correlated to an output of the TIA, to ii) a reference signal to which the output of the TIA is compared;

until a predetermined condition is met, programming a programmable current source using ones of the series of digitized current values, the programmable current source generating the reference current threshold;

after the predetermined condition is met, locking the programmable current source to a most recent one of the digitized current values; and in response to the reference current threshold generated by the programmable current source, producing the reference signal.

15. The method of claim 14, further comprising, deriving the signal correlated to the output of the TIA from a tap of a feedback resistor of the TIA.

16. The method of claim 14, wherein the series of digitized current values is produced by, in response to the plurality of input pulses, comparing i) the signal correlated to the output of the TIA, to ii) the reference signal; and in response to said comparisons resulting in a predetermined outcome, incrementing a count; wherein values of the count provide the series of digitized current values.

17. The method of claim 14, further comprising:

counting pulses of the output of the TIA; and generating said predetermined condition in response to a predetermined count of said pulses.

18. The method of claim 14, further comprising, storing the digitized current value to which the programmable current is locked in one-time programmable logic.

* * * * *